US012658862B2

(12) United States Patent
Cosentino

(10) Patent No.: US 12,658,862 B2
(45) Date of Patent: Jun. 16, 2026

(54) VARIABLE-GAIN AMPLIFIER, CORRESPONDING DEVICE AND METHOD

(71) Applicant: STMicroelectronics S.r.l., Agrate Brianza (IT)

(72) Inventor: Gaetano Cosentino, Catania (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 529 days.

(21) Appl. No.: 18/308,850

(22) Filed: Apr. 28, 2023

(65) Prior Publication Data

US 2023/0361727 A1 Nov. 9, 2023

(30) Foreign Application Priority Data

May 6, 2022 (IT) ......................... 102022000009323

(51) Int. Cl.
*H03F 3/19* (2006.01)
*H03G 3/30* (2006.01)

(52) U.S. Cl.
CPC ................. *H03F 3/19* (2013.01); *H03G 3/30* (2013.01); *H03F 2200/451* (2013.01); *H03G 2201/103* (2013.01)

(58) Field of Classification Search
CPC ....... H03F 3/19; H03F 2200/451; H03G 3/30; H03G 2201/103
USPC ........................................................ 330/278
See application file for complete search history.

(56) References Cited

U.S. PATENT DOCUMENTS

| | | | | | |
|---|---|---|---|---|---|
| 3,655,992 | A | * | 4/1972 | Ohno | ................... G05D 3/1463 |
| | | | | | 318/591 |
| 5,329,312 | A | * | 7/1994 | Boisvert | .................. H04N 5/18 |
| | | | | | 348/E5.079 |
| 5,486,791 | A | * | 1/1996 | Spitalny | ............... H03G 1/0088 |
| | | | | | 330/84 |
| 2005/0020227 | A1 | * | 1/2005 | Kumagawa | .......... H03G 3/3052 |
| | | | | | 455/234.1 |
| 2009/0066431 | A1 | | 3/2009 | Shin et al. | |

(Continued)

OTHER PUBLICATIONS

Giannini, Vito, et al., "Flexible Baseband Analog Circuits for Software-Defined Radio Front-Ends," IEEE Journal of Solid-State Circuits, vol. 42, No. 7, Jul. 2007, pp. 1501-1512.

(Continued)

*Primary Examiner* — Hafizur Rahman
(74) *Attorney, Agent, or Firm* — Slater Matsil, LLP

(57) ABSTRACT

A circuit includes an amplifier and a feedback network coupled between the input and the output of the amplifier. The feedback network includes a plurality of parallel coupled branches, each branch having a first selection switch coupled to the input, a second selection switch coupled to the output, and an impedance between the first and second selection switches. Each branch includes a plurality of signal feedback paths coupled in parallel, each having a tuning switch coupled between the first selection switch and the second selection switch of that branch. A control unit is coupled to the feedback network and configured to vary a gain of the amplifier by selectively placing the first and second selection switches of each branch in a conductive state or a non-conductive state and selectively activating respective tuning switches of any branch having first and second selection switches in the conductive state.

22 Claims, 3 Drawing Sheets

(56)                    References Cited

U.S. PATENT DOCUMENTS

| | | | |
|---|---|---|---|
| 2009/0096528 A1* | 4/2009 | Nakai ................. | H03G 3/3026 |
| | | | 330/278 |
| 2013/0259163 A1* | 10/2013 | Mikhemar ........... | H03F 1/0205 |
| | | | 375/318 |
| 2015/0048885 A1* | 2/2015 | Chiang ............... | H03G 1/0023 |
| | | | 330/254 |
| 2018/0351535 A1 | 12/2018 | Karmaker et al. | |
| 2022/0209721 A1* | 6/2022 | Plourde ................... | H03F 1/42 |

OTHER PUBLICATIONS

Kim, Jongsik, et al., "A Wide-Band CMOS LC VCO With Linearized Coarse Tuning Characteristics," IEEE Transactions on Circuits and Systems—II: Express Briefs, vol. 55, No. 5, May 2008, pp. 399-403.

* cited by examiner

VARIABLE-GAIN AMPLIFIER, CORRESPONDING DEVICE AND METHOD

CROSS-REFERENCE TO RELATED APPLICATIONS

This application claims the priority benefit of Italian patent application number 102022000009323, filed on May 6, 2022, which is hereby incorporated by reference to the maximum extent allowable by law.

TECHNICAL FIELD

The description relates to a variable-gain amplifier as well as a corresponding device and method.

BACKGROUND

Low-noise amplifiers (LNAs) configured to operate as variable-gain amplifiers (VGAs) in the radiofrequency (RF) range can be supplied with medium voltages (e.g., 1.8 to 2.5 will V) with a non-negligible power consumption.

This may be the case of amplifiers operating at wavelengths of the order of 65 nm and including plural stages (e.g., two stages).

The capability of providing several RF VGA gain steps of, e.g., 1 dB each over a sufficiently broad gain range (for instance, at least 30 dB from −10 dB to +20 dB with an input power from −97.5 dBm up to +4 dBm) is a desirable feature for such amplifiers.

Applicability with low-voltage (1.1 V, for instance) nanometer technology would be likewise desirable.

SUMMARY

Embodiments relate to variable-gain amplifiers (VGAs). Solutions according to the description can be used, for instance, in the automotive sector; satellite radio and online radio services are possible exemplary areas of interest.

One or more embodiments contribute in addressing adequately the issues discussed in the foregoing.

One or more embodiments may relate to a corresponding device (e.g., a satellite radio receiver).

One or more embodiments may relate to a corresponding method.

Solutions as exemplified can provide a number of advantages, such as to offer a higher gain and wider gain range, including attenuation up to −10 dB without noise figure (NF) penalty; to facilitate a high-level integration using a low-voltage and single stage amplifier; may comprise an auxiliary high-impedance buffer that facilitates boosting the maximum available gain thus increasing the isolation of a radiofrequency (RF) variable-gain amplifier (VGA) capable of driving a complex gain network; involve a sort of split approach in providing a gain network including a high-gain range network in a RF VGA core capable of boosting the maximum gain and facilitating using of sub-GHz amplifier architectures in GHz bands; extend the RF VGA gain range (including attenuation) while boosting the maximum gain of an amplifier; can be used either in single-ended and differential topologies; to facilitate providing a single stage low-noise amplifier configured for operation as VGA in the RF range; to facilitate increasing the number of low-noise amplifier gain steps in comparison with conventional approaches with the capability of operating at higher frequencies in comparison with conventional approaches; to provide a high number of small gain steps such as (at least)

30 steps of 1 dB (or less) gain each; and/or can be advantageously manufactured using low-voltage and high-performance advanced CMOS technologies.

BRIEF DESCRIPTION OF THE DRAWINGS

One or more embodiments will now be described, by way of example only, with reference to the annexed FIGURES, wherein.

Corresponding numerals and symbols in the different FIGURES generally refer to corresponding parts unless otherwise indicated.

The FIGURES are drawn to clearly illustrate the relevant aspects of the embodiments and are not necessarily drawn to scale. The edges of features drawn in the FIGURES do not necessarily indicate the termination of the extent of the feature.

Also, for the sake of simplicity and ease of explanation, a same designation may be applied throughout this description to designate a circuit node or line as well as a signal occurring at that node or line.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

Figure 1:
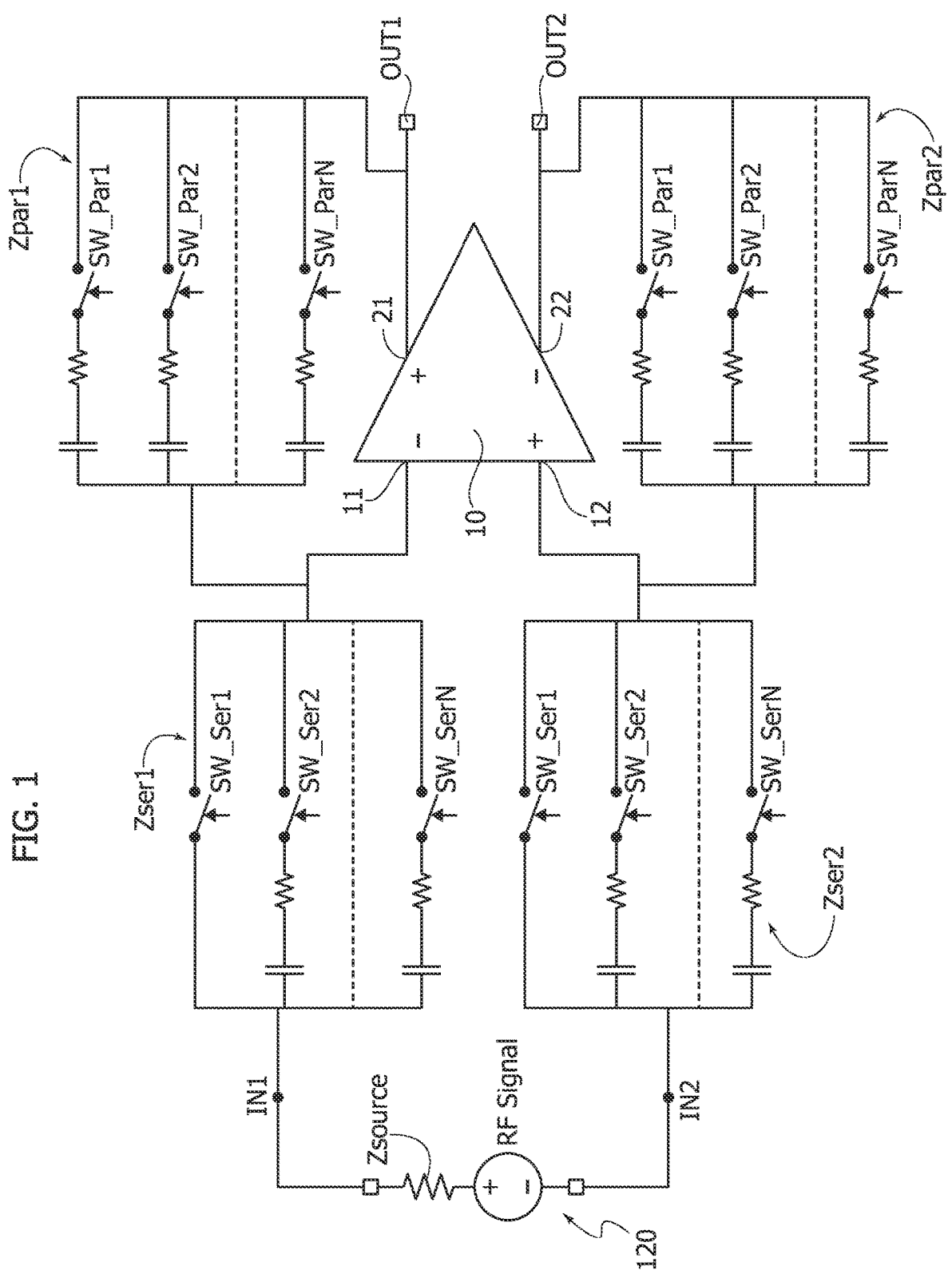
FIG. 1 is a circuit diagram of a conventional variable-gain amplifier (VGA)

FIG. 1 is a circuit diagram exemplary of conventional architecture of a radiofrequency (RF) variable-gain amplifier (VGA) based on a differential stage 10 (an operational amplifier or op-amp, for instance).

The conventional VGA illustrated in FIG. 1 adopts a differential layout, based on a fully differential amplifier 10 having a differential input 11, 12 and a differential output 21, 22.

Figure 2:
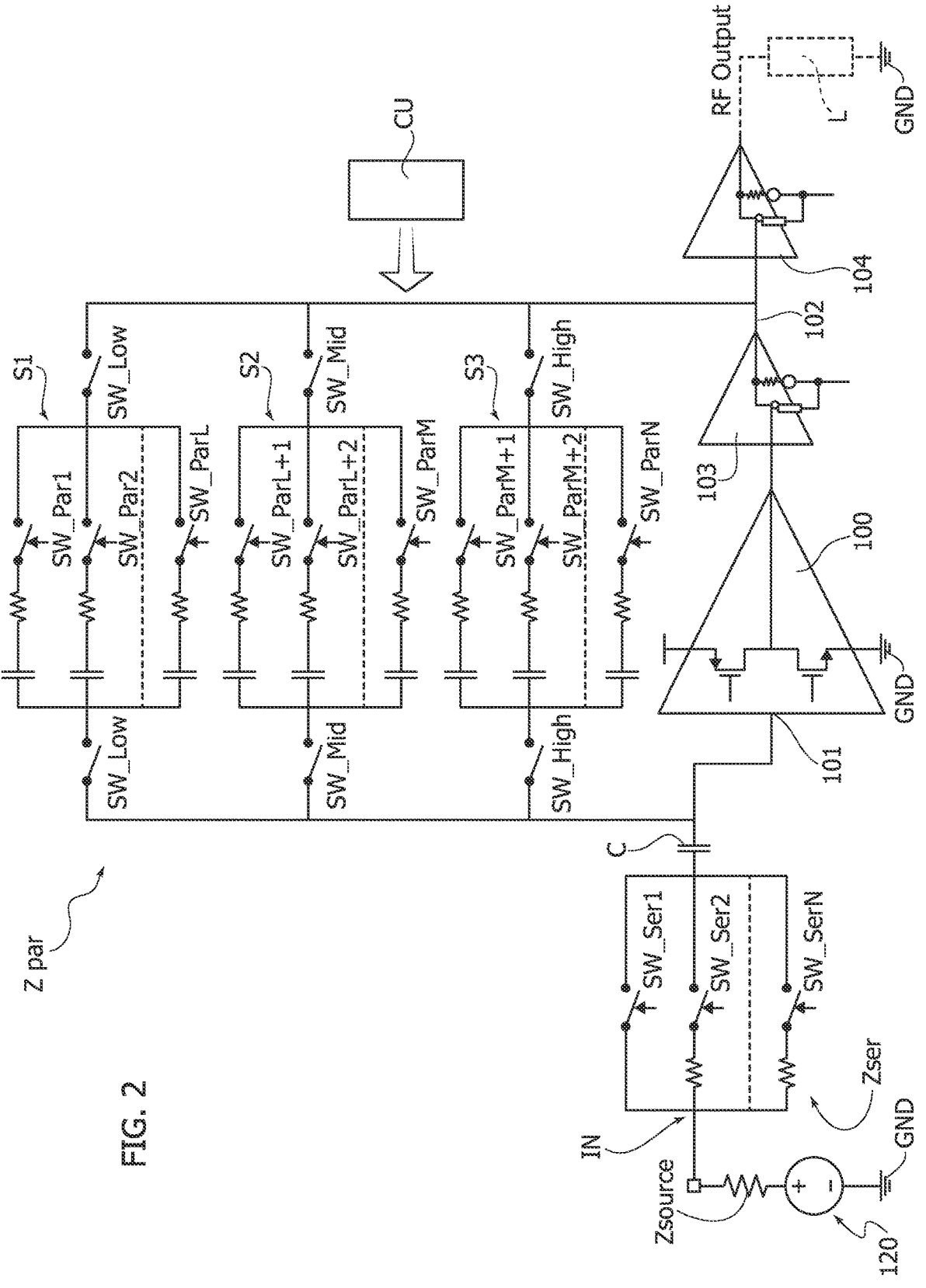
FIG. 2 is a circuit diagram of a VGA according to embodiments of the present description.

Conversely, FIG. 2 illustrates a variable-gain amplifier (VGA) according to embodiments of the present description based on a single-ended architecture. This is primarily for simplicity: embodiments of the present description may in fact be implemented with a differential layout, based on a fully differential amplifier along the lines of FIG. 1.

In FIG. 1, reference 120 denotes a source of radio frequency signal RF signal having an associated source impedance Zsource.

The signal source 120 usually represents (this applies both to the conventional arrangement of FIG. 1 and to solutions according to embodiments of the present description as illustrated in FIG. 2) a distinct element from the amplifier architecture and thus may not be a part of the embodiments.

In the conventional arrangement illustrated in FIG. 1, the amplifier 10 has a first (inverting) input 11 and a second (non-inverting) input 12 as well as two outputs 21 and 22 configured to provide a (differential) output signal between output nodes OUT1 and OUT2.

In the conventional arrangement of FIG. 1, two variable-impedance feedback networks are coupled to the amplifier 10.

A first feedback network includes a first branch Zpar1 between the first output node OUT1 and the first (inverting) input node 11 of the amplifier 10, and a second branch Zser1 between the first input node 11 of the amplifier 10 and the first input node IN1 to the amplifier architecture.

A second feedback network includes a first branch Zpar2 between the second output node OUT2 and the second (non-inverting) input node 12 of the amplifier 10, and a second branch Zser2 between the second input node 12 of the amplifier 10 and the second input node IN2 to the amplifier architecture.

Each of the branches illustrated in FIG. 1, namely Zser1, Zpar1, Zser2, and Zpar2 in turn comprises the parallel connection of a plurality of lines that can be selectively activated (that is, made selectively conductive) via a respective switch SW_Par1, SW_Par2 . . . , SW_ParN and SW_Ser1, SW_Ser2, . . . , SW_SerN.

The various selectively activatable lines comprise (with possible exceptions, such as the first lines in the input branches Zser1, Zser2—where the switches SW_Ser1 are arranged) the series connection of a resistor and a capacitor: these elements are illustrated but not expressly labeled in FIG. 1.

Assuming for simplicity that the branch Zpar1 is identical to the branch Zpar2 (each with an impedance Zp that can be varied acting on the switches SW_Par1 to SW_parN) and the branch Zser1 is identical to the branch Zser2 (each with an impedance Zs that can be varied acting on the switches SW_Ser1 to SW_SerN), a simplified expression for the gain of an architecture as illustrated in FIG. 1 is $$\text{RF\_VGA Gain} = -Zp/(Zs + Zsource)$$

where the series impedance Zs of the branches Zser1, Zser2 can be seen as a series impedance between the impedance Zsource and the amplifier 10. In operation, Zs adds to Zsource, thus determining a desired gain (attenuation), while simultaneously providing an impedance increase to compensate a reduction in the impedance Zp.

The input impedance to the architecture (between the nodes IN1 and IN2) is given by the combination of the series impedance introduced by the branches Zser1, Zser2 and the parallel impedance Zp given by the branches Zpar1, Zpar2 selected for a specific gain.

Controlling the switches SW_Par1, . . . , SW_ParN and SW_Ser1, . . . , SW_SerN—that is, turning them selectively "on" (conductive) and "off" (non-conductive)-varies the number of the lines (essentially RC filters, that may be either identical or different in the various lines) connected in parallel in the branches Zser1, Zser2, Zpar1, Zpar2 thus varying the impedances Zs, Zp of these branches and, consequently, the gain RF_VGA Gain of architecture as illustrated in FIG. 1.

A corresponding automatic gain control (AGC) gain range can be set defining (for instance via a serial peripheral interface (SPI) not visible for simplicity) setting a corresponding word RF_Gain_SeL word setting maximum and minimum values for the gain range.

It is noted that the value for Zp in the (simplified) gain equation decreases once the RF VGA gain index is reduced step-by-step. To that effect, some series resistance may be added to achieve an adequate input matching over the whole gain range.

For instance, architecture as exemplified in FIG. 1 may operate over a gain range between a minimum gain value −10 dB (Word 0) to a maximum gain value of +23 dB (Word 31). It is noted that, as conventional in the art, the designation "gain" also encompasses negative gain values (dB), namely operation as an attenuator.

Structure and operation of architecture as exemplified in FIG. 1 is otherwise conventional in the art, which makes it unnecessary to provide a more detailed description herein.

As discussed in the introductory portion of the description, conventional low-noise RF VGA architectures as exemplified in FIG. 1 may require increased supply voltages (above the range of 1.8 to 2.5 V), e.g., due to the use of a two-stage amplifier.

It is likewise noted that inductor-based medium-voltage LNA/RF VGA amplifiers can be used in the GHz range, e.g., using high voltages: this facilitates obtaining a high linearity with the non-negligible drawback of increasing power consumption.

High power consumption (possibly related to the presence of two gain stages) and unavailability of low-voltage products are factors militating against developing radio generators having an embedded baseband stage operating at a low voltage to provide a complete receiver (tuner plus baseband stage) with reduced power absorption.

In principle, one could also consider using inverter-based amplifier topologies: this however may turn out to be critical at high frequencies (above 1 GHZ) and would also require a specific RC network configuration for each gain setting.

These issues are addressed by architecture as illustrated in FIG. 2.

In FIG. 2, parts or elements like parts or elements already discussed in connection with FIG. 1 are indicated with like reference symbols so that a corresponding description will not be repeated for brevity.

Architecture as illustrated in FIG. 2 is again built around a "core" amplifier stage 100 having and input node 101 and an output 102.

For simplicity, a single-ended structure is illustrated in FIG. 2, being otherwise understood that architecture as illustrated in FIG. 2 may adopt a (fully) differential layout as discussed previously in connection with FIG. 1.

Advantageously, the amplifier 100 has a (very) high output impedance.

A feedback branch such as the branch Zpar in FIG. 2 can be advantageously coupled to the output of a buffer stage 103 cascaded to the amplifier 100 to avoid undesired parasitics on the high-impedance output node of the amplifier 100.

It is otherwise noted that the presence of the buffer stage 103 is not mandatory.

A further (likewise optional) high impedance buffer 104 can be coupled to the output of the amplifier 100 (e.g., via the high-impedance buffer 103).

A load L (which, as the source 120, may be a distinct element from the embodiments) is coupled to the output of the amplifier 100 (e.g., at the output of the further buffer stage 104) to deliver thereto an output signal, e.g., RF output.

The further buffer 104 facilitates increasing the RF VGA reverse isolation thus reducing the amplitude of local oscillation tones and others spurious signals from a mixer and other circuits possibly connected to the input of the RF VGA architecture (source 120).

Also, the amplifier 100 will be assumed to be protected (as otherwise conventional in the art) from parasitics deriving from the gain network.

Architecture as exemplified in FIG. 2 comprises a (single) input branch Zser having a selectively variable impedance Zs essentially like the branches Zser1, Zser2 of FIG. 1 coupled between the (single) input node IN intended to be coupled to the signal source 120 and the (single) input node 101 of the amplifier 100 with the possible interposition of compensating capacitance C.

In architecture as exemplified in FIG. 2, the (or each of the) branches Zpar1, Zpar2 of FIG. 1 is replaced by, e.g., three sets or sections S1, S2, S3 of selectively activatable lines arranged between the output of the amplifier 100 (e.g., the output of the high impedance buffer 103) and the input 101 of the amplifier 100.

It is noted that three sets or sections S1, S2, S3 are merely exemplary. In various embodiments, a different a number of such sets or sections can be provided (e.g., five sections for a radio tuner) as a function of desired application features.

Referring to three sets S1, S2, S3 is primarily for simplicity, insofar as, for instance, the set of lines S1 can be regarded as devoted to cover a low-gain/attenuation portion of the VGA gain range, the set S2 can be regarded as intended to cover a mid-gain range section of the VGA gain range, and the set S3 can be regarded as intended to cover a high-gain section of the VGA range.

Whatever the number of sets or sections S1, S2, . . . , each set or section as illustrated has associated (at opposite sides thereof, that is, towards the input node 101 and/or the output node 102 of the amplifier 100) a pair of "insertion" switches SW_low; SW_mid; SW_high adapted to be switched under the control of a control unit CU such as an SPI interface between an active state where the switches SW_low or the switches SW_mid or the switches SW_high are "on", that is made conductive, thus connecting their respective set of lines S1, S2 or S3 between the output 102 and the input 101 of the amplifier 100, and an inactive or idle state (switches SW_low, SW_mid, SW_high "off," that is, non-conductive) wherein the respective set S1, S2, . . . is disconnected from the amplifier 100 and thus excluded from cooperation therewith.

As in the case of the lines Zpar1, Zpar2 in FIG. 1, the lines in the sets S1, S2, . . . , Sn (here n=3) include the series connection of a resistor and a capacitor (again shown, but not expressly labelled for simplicity in FIG. 2) and an associated switch, again controlled by the control unit CU.

In the exemplary case of three sets S1, S2, S3 presented herein, the switches in the parallel lines can be regarded as arranged in turn in three sets, namely, a first set (SW_Par1, . . . . SW_ParL) in the set S1, a second set of switches (SW_ParL+1, SW_ParL+2, . . . , SW_ParM) for the second set S2, and a third set of switches (SW_ParM+1, SW_ParM+2, . . . , SW_ParN for the third set S3).

The switches SW_Par1 to SW_ParN can be switched alternatively "on" (conductive) or "off" (non-conductive) under the control of the unit CU.

Arranging the selectively activatable lines associated to these switches in plural sets (e.g., three sets or sections S1, S2, S3 by way of example) facilitates activating (only) the set that is actually used to obtain a certain gain range.

To summarize, architecture as illustrated in FIG. 2 is exemplary of a circuit comprising an amplifier 100 having at least one input node 101 configured to receive an input signal IN and at least one output node 102 configured to provide to a load L an output signal RF Output that is an amplified or attenuated replica of the input signal IN to which a selectively variable gain (possibly including attenuation) applied.

Architecture as illustrated in FIG. 2 also comprises at least one feedback network namely Zpar and Zser that comprises a variable-impedance feedback branch Zpar configured to couple the output node 102 of the amplifier 100 to the input node 101 of the amplifier 100.

The gain RF_VGA Gain applied to the input signal IN is thus a function (e.g., via Zp and Zs) of the impedance value of the variable-impedance feedback branch Zpar.

In architecture as illustrated in FIG. 2 the variable-impedance feedback branch Zpar comprises a plurality of (e.g., three) sections S1, S2, S3.

Each section S1, S2 or S3 of the feedback branch Zpar in turn comprises insertion switch circuitry (namely SW_low, SW_mid, SW_high) configured to be controllably (e.g., via the unit CU) switched between a conductive state and a non-conductive state.

In the conductive state, a feedback signal path from the output node 102 to the input node 101 of the amplifier 100 is provided through the respective section of the feedback branch in response to the respective insertion switch circuitry SW_low, SW_mid, SW_high being in the conductive state.

In the non-conductive state, the feedback signal path from the output node 102 to the input node 101 of the amplifier 100 is interrupted in response to the insertion switch circuitry SW_low, SW_mid, SW_high being in the non-conductive state.

In architecture as illustrated in FIG. 2, each section S1, S2 or S3 of the feedback branch Zpar also comprises respective gain-control switch circuitry (namely SW_Par1, . . . . SW_ParL; SW_ParL+1, . . . . SW_ParM; SW_ParM+1, . . . . SW_ParN) arranged in the feedback signal path from the output node to the input node 101 of the amplifier.

Such gain-control switch circuitry SW_Par1, . . . . SW_ParL; SW_ParL+1, . . . . SW_ParM; SW_ParM+1, . . . . SW_ParN is configured to selectively vary the gain applied to the input signal IN varying the impedance of the feedback signal path from the output node 102 to the input node 101 of the amplifier 100 provided through the respective section of the variable-impedance feedback branch Zpar in response to the respective insertion switch circuitry being in the conductive state.

Advantageously, in architecture as illustrated in FIG. 2, the insertion switch circuitry comprises a pair of switches SW_low, SW_mid, SW_high coupled to the output node 102 and the input node 101 of the amplifier 100, respectively.

Advantageously, in architecture as illustrated in FIG. 2 the feedback signal path from the output node 102 to the input node 101 of the amplifier 100 provided through the respective section of the variable-impedance feedback branch Zpar comprises a parallel arrangement of a plurality of electrically conductive lines having respective impedances.

The associated gain-control switch circuitry comprises gain-control switches SW_Par1, . . . . SW_ParL; SW_ParL+

1, . . . . SW_ParM; SW_ParM+1, . . . . SW_ParN that are arranged in respective ones of the plurality of electrically conductive lines in the feedback signal path provided through the respective section S1, S2 or S3 of the variable-impedance feedback branch Zpar.

The gain-control switches SW_Par1, . . . . SW_ParL; SW_ParL+1, . . . . SW_ParM; SW_ParM+1, . . . . SW_ParN) switches (SW_Par1, . . . . SW_ParL; SW_ParL+1, . . . . SW_ParM; SW_ParM+1, . . . . SW_ParN are configured to operate (under the control of the unit CU) in order to selectively include or exclude the respective electrically conductive line from the parallel arrangement of a plurality of electrically conductive lines.

In that way, it is possible to selectively vary the impedance Zp (see the formula for the gain RF_VGA Gain reproduced previously) of the feedback signal path from the output node 102 to the input node 101 of the amplifier 100 provided through the respective section of the variable-impedance feedback branch in response to the respective insertion switch circuitry being in the conductive state.

Advantageously, the amplifier 100 comprises a high output impedance amplifier including and/or have cascaded thereto (see, e.g., the buffer stage 103) an impedance boosting buffer stage.

Advantageously, at least one of the sections of the feedback branch Zpar (e.g., the section S3) may be incorporated in the amplifier 100.

Figure 3:
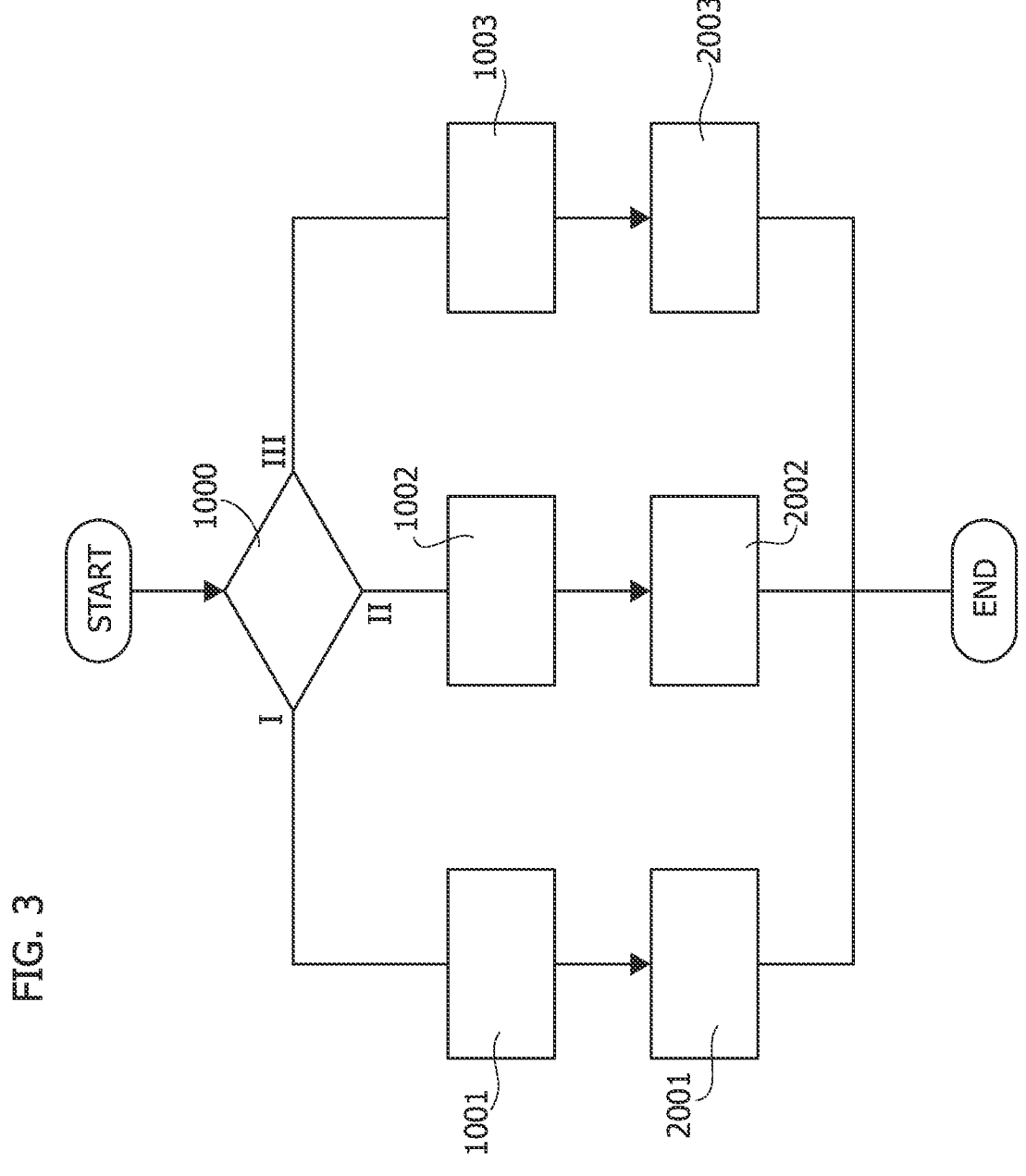
FIG. 3 is a flow chart exemplary of possible operation of a VGA according to embodiments of the present description.

Possible operation of architecture as illustrated in FIG. 3 is exemplified in the flow chart of FIG. 3.

In FIG. 3, the block 1000 denotes the selection (e.g., by a user device via pre-command sent to the control unit CU) of a desired gain range for RF_VGA gain.

For instance (by referring to the exemplary case presented herein, where three sets S1, S2 and S3 are considered) such a selection may be between a low-gain/attenuation range-indicated by I, a mid-gain section-indicated by II, and a high-gain range section-indicated by III.

Depending on the selection represented by block 1000, the system may evolve to operating states 1001, 1002 or 1003, where only one of the sets S1, S2, or S3 is activated.

For instance, in the operation represented by block 1001, only the set S1 is activated with the switches SW_low made conductive, while the two other sets S2 and S3 are inactive, with the switches SW_mid and the switches SW_high non-conductive. In the operation represented by block 1002, only the set S2 is activated with the switches SW_mid made conductive, while the two other sets S1 and S3 are inactive, with the switches SW_low and the switches SW_high non-conductive. In the operation represented by block 1003, only the set S3 is activated with the switches SW_high made conductive, while the two other sets S1 and S2 are inactive, with the switches SW_low and the switches SW_mid non-conductive.

For instance, in operation as exemplified by block 1003 the RF VGA operates in the high-gain range with only the set S3 enabled and the parasitic contributions of the other gain/attenuation networks (S1 and S2, in the case exemplified by block 1003) are reduced due to the fact that the associated insertion switches SW_low and SW_mid are open (non-conductive).

The blocks 2001, 2002 and 2003 are exemplary of the "fine tuning" selection of the RF VGA range performed (within the selected and activated range section) here low-gain/attenuation S1, mid-gain S2 and high-gain S3) by acting on the switches SW_Par1, . . . SW_ParL in the first set S1 with the switches SW_low made conductive (and SW_mid plus SW_high non-conductive), the switches SW_ParL+1, . . . . SW_ParM in the second set S2 with the switches SW_mid made conductive (and SW_low plus SW_high non-conductive), the switches SW_ParM+1, . . . . SW_ParN in the third set S3 with the switches SW_high made conductive (and SW_low plus SW_mid non-conductive).

The blocks 2001, 2002 and 2003 can control the switches SW_Par1 . . . SW_ParL (block 2001), or the switches SW_ParL+1 . . . . SW_ParM (block 2002), or the switches SW_ParM+1 . . . . SW_ParN (block 2003). That is, turning them selectively "on" (conductive) and "off" (non-conductive) varies the number of the lines (here again essentially RC filters, that may be either identical or different in the various lines) connected in parallel in the sections S1, S2 or S3 thus varying the impedances Zs, Zp of these branches and, consequently varying, within the gain range (e.g., low/attenuation, mid or high) associated with the selected section S1, S2 or S3 the gain RF_VGA Gain of architecture.

It will be otherwise appreciated that mutually exclusive operation of the sections S1, S2 or S3 (namely only one section out of the sections S1, S2 or S3 being active) as illustrated in FIG. 3 by way of example is not mandatory.

Various "mixed" connection schemes can be envisaged.

For instance (and merely by way of example) the section S3 may be active with sections S1 and S2 inactive in a high-gain range, the sections S1 and S2 may be (simultaneously) active with section S3 inactive in a mid-gain range, and the sections S1, S2 and S3 may be (simultaneously) all active in a low-gain range where a low impedance is desirable.

That is, the insertion switch circuitry SW_low, SW_mid, SW_high can be switched to the conductive state in one or more of the sections S1, S2, or S3 of the variable-impedance feedback branch Zpar and to the non-conductive state in any other section or sections S1, S2, or S3 of the variable-impedance feedback branch Zpar.

In any case, the gain applied to the input signal IN can be varied by varying the impedance of the feedback signal path from the output node 102 to the input node 101 of the amplifier 100 provided through the one or more sections S1, S2 or S3 of the variable-impedance feedback branch Zpar having their insertion switch circuitry SW_low, SW_mid, SW_high switched to the conductive state.

Such "combined" modes of operation may facilitate obtaining a wide gain range passing from a (very) high impedance value to a (very) low impedance value (e.g., in order to obtain attenuation).

It is noted that, taken per se, architecture as illustrated lends itself to be operated also in a maximum gain configuration (with all the sections S1, S2, S3 of the feedback network inactive).

As noted, a number of sets or sections different from three (S1, S2 and S3) can be provided.

Like in conventional architecture as illustrated in FIG. 1 an input branch of the feedback network (noted Zser in FIG. 2) can be provided coupled between the input node IN and the input 101 of the amplifier 100 (possibly via a capacitor C).

The switches SW_ser1 SW_serN in the input branch ZSer can be controlled differently as a function of which of the sets S1, S2, S3 is/are activated.

For instance, the switches in the branch Zser can be closed when operating in the high-gain range (set S3 activated) as this facilitates reducing the noise figure.

Conversely, they can be selectively opened when operating in the low-gain/attenuation range portion (set S1 activated and set S2 and S3 de-activated) or in the mid-gain range portion (set S2 activated and sets S1 and S3 deactivated) to facilitate adequate input matching for the whole RF VGA gain range.

That is, in architecture as exemplified in FIG. 2, the feedback network comprises, in addition to the multi-section (e.g., S1, S2, S3) gain control branch Zpar, a further variable-impedance feedback branch (namely Zser) configured to apply the input signal IN to the input node 101 of the amplifier 100 via an input signal path through the further variable-impedance feedback branch Zser (and, possibly, the capacitance C.

Architecture as exemplified in FIG. 2 thus comprises further impedance-varying switch circuitry (namely SW_Ser1, . . . . SW_SerN) arranged in the further variable-impedance feedback branch Zser configured to selectively vary the impedance of the input signal path through the further variable-impedance feedback branch Zser.

In architecture as exemplified in FIG. 2 the further variable-impedance feedback branch Zser comprises a parallel arrangement of a plurality of electrically conductive lines having respective impedances along with further impedance-varying switch circuitry that comprises impedance control switches SW_Ser1, . . . . SW_SerN arranged in respective ones of the electrically conductive lines in the further variable-impedance feedback branch Zser.

These impedance control switches SW_Ser1, . . . . SW_SerN are configured to selectively include or exclude the respective electrically conductive line from the parallel arrangement of electrically conductive lines of the feedback branch Zser thus selectively varying the impedance "seen" by the input signal IN applied to the input signal path through the further variable-impedance feedback branch Zser.

Operation of architecture as illustrated in FIG. 2 thus advantageously comprises adjusting the input impedance experienced by the input signal IN applied to the least one input node 101 of the amplifier 100 by jointly varying the impedance of the feedback signal path from the at least one output node 102 to the input node 101 of the amplifier 100 provided through the one section S1, S2 or S3 of the feedback branch Zpar that is activated by having the insertion switch circuitry SW_low, SW_mid, or SW_high switched to the conductive state, and the impedance of the input signal path through the further variable-impedance feedback branch Zser.

In certain embodiments, a section of the feedback branch Zpar (e.g., the high-gain section S3 can be incorporated in the RF VGA core amplifier 100. This facilitates further reducing the parasitic impact of the gain network on the high impedance amplifier output.

It is noted that layout parasitic poles may give rise to limitations also in the attenuation range.

Examples as presented herein facilitate a notable increase of the maximum gain (e.g., 6-7 dB from 16-17 dB up to 23 dB and more) in comparison with the conventional approaches as exemplified in FIG. 1.

This facilitates extending the use of low/medium RF VGA architecture in the GHz band (e.g., 2.33 GHZ).

It is again noted that, while the solution represented in FIG. 2 adopts a single-ended structure, the same underlying principles can be extended (that is duplicated or mirrored) in differential RF VGA architecture of the kind exemplified in FIG. 1.

Without prejudice to the underlying principles, the details and embodiments may vary, even significantly, with respect to what has been described by way of example only without departing from the extent of protection.

The extent of protection is determined by the annexed claims.

What is claimed is:

1. A circuit, comprising:

an amplifier having an input node and an output node, an output signal carried at the output node being a replica of an input signal carried at the input node with a variable gain applied thereto; and a feedback network coupled between the input node and the output node of the amplifier, the feedback network comprising a variable-impedance feedback branch comprising a plurality of sections arranged as parallel coupled branches, each section of the variable-impedance feedback branch having a first insertion switch coupled to the input node of the amplifier, a second insertion switch coupled to the output node of the amplifier, and an impedance between the first insertion switch and the second insertion switch, wherein the gain applied to the input signal is a function of an impedance value of the variable-impedance feedback branch, wherein each section of the variable-impedance feedback branch comprises a plurality of signal feedback paths coupled in parallel, each signal feedback path comprising a gain-control switch coupled between the first insertion switch and the second insertion switch of that section, wherein the first insertion switch and the second insertion switch are configured to be controllably switched between a conductive state and a non-conductive state, wherein a signal feedback path from the output node of the amplifier to the input node of the amplifier is provided through the respective section of the variable-impedance feedback branch in response to the respective first insertion switch and second insertion switch being in the conductive state, wherein each signal feedback path is interrupted in response to the first insertion switch and the second insertion switch being in the non-conductive state, and wherein the gain-control switches are configured to selectively vary the gain applied to the input signal by varying the impedance of each signal feedback path by selectively activating respective gain-control switches of a section having the first insertion switch and the second insertion switch in the conductive state.

2. A device comprising:

the circuit of claim 1;

a signal source coupled to the input node of the amplifier; and an electrical load coupled to the output node of the amplifier.

3. The circuit of claim 1, wherein the signal paths comprise a parallel arrangement of a plurality of electrically conductive lines having respective impedances, wherein the gain-control switches are arranged in respective ones of the plurality of electrically conductive lines provided through the respective section of the variable-impedance feedback branch, and wherein the gain-control switches are configured to selectively include or exclude the respective electrically conductive line from the parallel arrangement of a plurality of electrically conductive lines thus selectively varying the impedance from the output node of the amplifier to the input node of the amplifier provided through the respective section of the variable-impedance feedback branch in response to the respective first insertion switch and second insertion switch being in the conductive state.

4. The circuit of claim 1, wherein the feedback network comprises:

a further variable-impedance feedback branch configured to apply the input signal to the input node of the amplifier via an input signal path through the further variable-impedance feedback branch; and further impedance-varying switch circuitry arranged in the further variable-impedance feedback branch, the further impedance-varying switch circuitry configured to selectively vary the impedance of the input signal path through the further variable-impedance feedback branch.

5. The circuit of claim 4, wherein the further variable-impedance feedback branch comprises a parallel arrangement of a plurality of electrically conductive lines having respective impedances, wherein the further impedance-varying switch circuitry comprises impedance control switches arranged in respective ones of the plurality of electrically conductive lines in the further variable-impedance feedback branch, and wherein the impedance control switches are configured to selectively include or exclude the respective electrically conductive line from the parallel arrangement of a plurality of electrically conductive lines, thus selectively varying the impedance of the input signal path through the further variable-impedance feedback branch.

6. The circuit of claim 1, wherein the amplifier comprises a high output impedance amplifier.

7. The circuit of claim 6, wherein the amplifier includes an impedance-boosting buffer stage.

8. The circuit of claim 6, wherein the amplifier has cascaded thereto an impedance-boosting buffer stage.

9. The circuit of claim 1, wherein at least one of the plurality of sections of the variable-impedance feedback branch is incorporated in the amplifier.

10. The circuit of claim 1, wherein the gain-control switches are is configured to selectively vary the gain applied to the input signal to a level in a range of –10 dB to 23 dB in steps of 1 dB or less.

11. A circuit comprising:

an amplifier having an input node and an output node;

a feedback network coupled between the input node and the output node of the amplifier, the feedback network comprising a plurality of parallel coupled branches, each branch having a first selection switch coupled to the input node, a second selection switch coupled to the output node, and an impedance between the first selection switch and the second selection switch, wherein each branch comprises a plurality of signal feedback paths coupled in parallel, each signal feedback path comprising a tuning switch coupled between the first selection switch and the second selection switch of that branch; and a control unit coupled to the feedback network and configured to vary a gain of the amplifier by selectively placing the first and second selection switches of each branch in a conductive state or a non-conductive state so that the input node and the output node of the amplifier are electrically isolated from the impedance of any branch having first and second selection switches in the non-conductive state, the control unit further being configured to selectively vary the gain by varying the impedance of each feedback signal path by selectively activating respective tuning switches of any branch having first and second selection switches in the conductive state.

12. A device comprising:

the circuit of claim 11;

a signal source coupled to the input node of the amplifier; and an electrical load coupled to the output node of the amplifier.

13. The circuit of claim 11, further comprising a variable-impedance branch coupled to the input node of the amplifier, the variable-impedance branch comprising a plurality of signal lines coupled in parallel, each signal line having an impedance and a tuning switch coupled to the control unit.

14. The circuit of claim 11, further comprising:

a signal source; and a variable-impedance branch coupled between the signal source and the input node of the amplifier, the variable-impedance branch comprising a plurality of signal lines coupled in parallel, each signal line having an impedance and a tuning switch coupled to the control unit.

15. The circuit of claim 11, wherein the amplifier comprises a high output impedance amplifier.

16. The circuit of claim 15, wherein the amplifier includes an impedance-boosting buffer stage or wherein the amplifier has cascaded thereto an impedance-boosting buffer stage.

17. The circuit of claim 11, wherein the control unit is configured to vary the gain of the amplifier anywhere in a range of –10 dB to 23 dB in steps of 1 dB or less.

18. A method of operating a circuit, the method comprising:

having a circuit comprising an amplifier and a feedback network coupled between an input node and an output node of the amplifier, the feedback network comprising a plurality of parallel coupled branches, each branch having a first selection switch coupled to the input node of the amplifier, a second selection switch coupled to the output node of the amplifier, and an impedance between the first selection switch and the second selection switch, each branch comprising a plurality of signal feedback paths coupled in parallel, each signal feedback path comprising a tuning switch coupled between the first selection switch and the second selection switch of that branch;

applying an input signal to the input node of the amplifier;

varying, by a control unit coupled to the feedback network, a gain of the amplifier by selectively placing the first and second selection switches of each branch in a conductive state or a non-conductive state so that the input node and the output node of the amplifier are electrically isolated from the impedance of any branch having first and second selection switches in the non-conductive state; and selectively varying, by the control unit, the gain by varying the impedance of each feedback signal path by selectively activating respective tuning switches of any branch having first and second selection switches in the conductive state.

19. The method of claim 18, wherein applying the input signal comprises selectively varying an impedance of the input signal.

20. The method of claim 18, further comprising providing an output signal at the output node of the amplifier, the output signal being a replica of the input signal having the selectively varying gain applied thereto.

21. The method of claim 18, wherein the gain varies between −10 dB and 23 db.

22. The method of claim 18, wherein the gain varies in steps of 1 dB or less.

\* \* \* \* \*